United States Patent
Ogata et al.

(10) Patent No.: US 9,289,876 B2
(45) Date of Patent: Mar. 22, 2016

(54) METHOD AND APPARATUS FOR POLISHING WORK

(71) Applicant: SUMCO CORPORATION, Tokyo (JP)

(72) Inventors: Shinichi Ogata, Tokyo (JP); Keiichi Takanashi, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/405,660

(22) PCT Filed: Jun. 24, 2013

(86) PCT No.: PCT/JP2013/003935
§ 371 (c)(1),
(2) Date: Dec. 4, 2014

(87) PCT Pub. No.: WO2014/002467
PCT Pub. Date: Jan. 3, 2014

(65) Prior Publication Data
US 2015/0165585 A1    Jun. 18, 2015

(30) Foreign Application Priority Data

Jun. 25, 2012 (JP) ................................. 2012-142036

(51) Int. Cl.
*B24B 37/08* (2012.01)
*H01L 21/304* (2006.01)
*B24B 37/013* (2012.01)

(52) U.S. Cl.
CPC .............. *B24B 37/08* (2013.01); *B24B 37/013* (2013.01); *H01L 21/304* (2013.01)

(58) Field of Classification Search
CPC ...... B24B 37/08; B24B 37/013; H01L 21/304
USPC .......................... 451/5, 9, 10, 11, 41, 261–262
See application file for complete search history.

(56) References Cited

U.S. PATENT DOCUMENTS 3,097,458 A * 7/1963 Richmond .............. B24B 37/08
257/417
3,662,498 A * 5/1972 Caspers ................ B24B 53/017
125/11.19

(Continued)

FOREIGN PATENT DOCUMENTS

JP             9-70753 A      3/1997
JP          2000-263401      9/2000

(Continued)

OTHER PUBLICATIONS

Office Action issued in Korean family member Patent Appl. No. 10-2014-7036061, dated Nov. 18, 2015 , along with an English-language translation thereof.

(Continued)

*Primary Examiner* — George Nguyen
(74) *Attorney, Agent, or Firm* — Greenblum & Bernstein, P.L.C.

(57) ABSTRACT

The method for polishing work, in which work in a retaining opening provided in a carrier plate, the center of the retaining opening being positioned apart from the center of the carrier plate, is sandwiched between an upper plate and a lower plate provided with polishing pads; the carrier plate is rotated by a drive mechanism; and the upper plate and the lower plate are also rotated, so that the distance changes periodically with the rotation of the carrier plate, and both surfaces of the work are simultaneously polished, includes the steps of: measuring at least one of torque of the drive mechanism, the upper plate, and the lower plate; and controlling an amount of polishing removal of the work based on the fluctuation of the torque component due to the periodic change in the distance.

8 Claims, 14 Drawing Sheets

(56) References Cited

U.S. PATENT DOCUMENTS

| | | | | |
|---|---|---|---|---|
| 3,813,828 | A * | 6/1974 | Bennett | B24B 49/16 451/28 |
| 6,135,854 | A * | 10/2000 | Masumura | B24B 37/08 451/291 |
| 7,008,308 | B2 * | 3/2006 | Bjelopavlic | B24B 37/28 451/41 |
| 8,221,198 | B2 * | 7/2012 | Tokukra | B24B 37/28 451/261 |
| 2001/0024931 | A1 * | 9/2001 | Buzzetti | B24B 19/226 451/11 |
| 2002/0115387 | A1 * | 8/2002 | Wenski | B24B 37/0056 451/41 |
| 2002/0173222 | A1 * | 11/2002 | Benning | B24B 37/08 451/5 |
| 2006/0178089 | A1 * | 8/2006 | Ueno | B24B 37/28 451/170 |
| 2007/0021042 | A1 * | 1/2007 | Schmolke | B24B 37/28 451/170 |
| 2007/0054606 | A1 * | 3/2007 | Nakamura | B24D 9/085 451/56 |
| 2009/0042487 | A1 * | 2/2009 | Tokura | B24B 49/16 451/41 |
| 2009/0298397 | A1 * | 12/2009 | Yamada | B24B 37/28 451/57 |
| 2011/0045748 | A1 * | 2/2011 | Lee | B24B 37/08 451/65 |
| 2012/0329373 | A1 * | 12/2012 | Ueno | B24B 37/08 451/262 |
| 2013/0032573 | A1 * | 2/2013 | Ogata | B24B 37/08 216/53 |

FOREIGN PATENT DOCUMENTS

| | | |
|---|---|---|
| JP | 2002-254299 | 9/2002 |
| JP | 2002-343754 A | 11/2002 |
| JP | 2004-106123 A | 4/2004 |
| JP | 2004-363181 A | 12/2004 |
| JP | 2012-69897 A | 4/2012 |
| KR | 10-2009-0015793 | 2/2009 |

OTHER PUBLICATIONS

International Search report, mail date is Sep. 24, 2013.

* cited by examiner

METHOD AND APPARATUS FOR POLISHING WORK

TECHNICAL FIELD

The present invention relates to a method and an apparatus for simultaneously polishing both front and back surfaces of a work such as, for example, a semiconductor wafer using a polishing pad.

BACKGROUND ART

In the production of a semiconductor wafer such as a silicon wafer, which is a typical example of a work subjected to polishing, in order to obtain a semiconductor wafer having more accurately controlled flatness quality and surface roughness quality, double-side polishing has been performed in which a semiconductor wafer is sandwiched between a pair of polishing plates having polishing pads, thereby simultaneously polishing both front and back surfaces of the wafer. The shape required for a semiconductor wafer (primarily the degree of flatness required for the entire surface and the periphery of the wafer) varies depending on the uses. It is necessary to determine the target amount of polishing removal of a semiconductor wafer depending on the requirements, thereby accurately controlling the amount of polishing removal. In particular, in order to improve the integrity of a large-scale integrated circuit, since the flatness of a semiconductor wafer is one of important factors, techniques for accurately controlling the amount of polishing removal of semiconductor wafers are desired.

Here, JP 2004-363181 A (PTL 1) discloses a polishing method in which the change in the drive current of a motor for driving polishing plates while the polishing on works proceeds such that the thickness of the works equals the thickness of the carrier plates for holding the works (specifically, the inflection point of the value of the current) is detected to terminate polishing. This polishing method is a method for detecting the termination of polishing based on the change in the drive current of the motor, that is, the torque of the polishing plates.

Further, JP 2012-069897 A (PTL 2) discloses a method for polishing a semiconductor wafer, in which the plate load current value of a double-side polishing apparatus for a semiconductor wafer is measured, and the standard deviation of the plate load current value is calculated per reference time, thus estimating the rate of progression of the polishing from the change in the standard deviation. PTL 2 also describes that due to the frictional resistance reduced as the polishing proceeds, the standard deviation of the plate load current value is reduced, and the standard deviation is presumably minimized when the thickness of the wafer and the thickness of the carrier plate come to be equal. This polishing method is a polishing method in which the progress status of polishing is estimated based on the standard deviation of the torque of the polishing plates.

CITATION LIST

Patent Literature

PTL 1: JP 2004-363181 A
PTL 2: JP 2012-069897 A

SUMMARY OF INVENTION

Technical Problem

However, in the polishing method in PTL 1, presumably, the inflection point of the current value is detected only with such a limited apparatus structure, in which the polishing pads provided on the polishing plates do not touch the carrier plates in a stage where the works are thicker than the carrier plates until the works and the carrier plates come to have the equal thickness. Even if the inflection point can be detected, the inflection point can be detected only after the current value is minimized, that is, after the thickness of the works becomes equal to that of the carrier plates. Accordingly, if the polishing is terminated after the detection of the inflection point, the work cannot be prevented from being excessively polished, which results in poor accuracy in the termination of the polishing of the work. Further, this polishing method does not make it possible to grasp the rate of the progression of the polishing before the end of the polishing. Thus, the polishing method disclosed in PTL 1 cannot accurately control the amount of polishing removal.

On the other hand, the polishing method disclosed in PTL 2 cannot control the amount of polishing removal of semiconductor wafers with high accuracy for the following reasons. First, if the load current value resulted from the change in the frictional resistance is significantly small as compared with background loads such as operating current and noise stationarily generated in the operation of a double-side polishing apparatus, the change would be buried in the fluctuation of the background loads itself. Further, even if the change in the standard deviation can be detected, the standard deviation to be calculated includes the fluctuation caused by the background loads in addition to the fluctuation caused by the friction. Since the fluctuation of the background loads itself fluctuates, the amount of polishing removal cannot be captured with sufficient accuracy. Accordingly, it is difficult to detect a change in the standard deviation. Moreover, the minimum value of the standard deviation cannot be detected only after the standard deviation is minimized. Accordingly, the termination of polishing after detecting the minimum value of the standard deviation likewise results in poor accuracy in the termination of the work. Namely, the polishing method disclosed in PTL 2 cannot control the amount of polishing removal with sufficient accuracy.

In view of the above problems, it is an object of the present invention to provide a method and an apparatus for polishing a work, which enable controlling the amount of polishing removal of a work with more accuracy.

Solution to Problem

In order to achieve the above object, the inventors of the present invention made various studies to obtain the following findings.

That is, a work is held in a retaining opening with the center being distant from the center of a relevant carrier plate; the carrier plate is sandwiched between an upper plate and a lower plate; and while a polishing apparatus is driven, the distance between the center of the upper plate and lower plate and the center of the work periodically changes with the rotation of the carrier plate. The torque of the drive mechanism of the carrier plate, the upper plate, or the lower plate includes a torque component that changes periodically in synchronization with the periodic change in that distance, which torque component has been extracted from the measured value of the torque. That torque component was an indication that is hardly affected by the background loads. Further, they found that the fluctuation of the torque component is reduced as the polishing proceeds, and is significantly reduced particularly when the thickness of the work becomes equal to that of the carrier plate. Based on such findings, the inventors have accomplished the present invention.

The present invention primarily includes following features.

A method for polishing a work, in which work held in a retaining opening provided in a carrier plate, the center of the retaining opening being positioned apart from the center of the carrier plate, is sandwiched between an upper plate and a lower plate each provided with a polishing pad; the carrier plate is rotated by a drive mechanism; and the upper plate and the lower plate are also rotated, so that the distance between the center of the upper plate and the lower plate and the center of the work changes periodically with the rotation of the carrier plate, and front and back surfaces of the work are simultaneously polished with the polishing pads comprising the steps of:

measuring at least one of torque of the drive mechanism, the upper plate, and the lower plate; and controlling an amount of polishing removal of the work based on the fluctuation of the torque component, on the torque component at the time when a certain angle of rotation of the carrier plate is achieved, or on the difference between the torque components at the times when two certain different angles of rotation of the carrier plate are achieved, due to the periodic change in the distance.

In the method for polishing a work, according to the present invention, it is preferable that a plurality of carrier plates provided with the respective works are provided between the upper plate and the lower plate, and said distances with respect to each work change synchronizedly.

In the method for polishing a work, according to the present invention, it is preferable that the polishing is terminated when the fluctuation of the torque component stops, when the torque component at the time when a certain angle of rotation of the carrier plate is achieved stops changing, or when the difference between the torque components at the times when two certain different angles of rotation of the carrier plate is eliminated.

In the method for polishing a work, according to the present invention, it is preferable that the torques of the upper plate and the lower plate are measured to thereby controlling the amount of polishing removal of the work using the torques.

In the method for polishing a work, according to the present invention, the work is preferably a silicon wafers obtained by slicing a silicon ingot.

Another method for polishing a works according to the present invention, in which work held in a retaining opening provided in a carrier plate, the center of the retaining opening being positioned apart from the center of the carrier plate, is sandwiched between an upper plate and a lower plate each provided with a polishing pad; the carrier plate is rotated by a drive mechanism; and the upper plate and the lower plate are also rotated, so that the distance between the center of the upper plate and the lower plate and the center of the work changes periodically with the rotation of the carrier plate, and front and back surfaces of the work are simultaneously polished with the polishing pads, comprising the steps of:

measuring at least one of current value of a motor of the drive mechanism, and current value of a motor for rotating at least one of the upper plate and the lower plate; and controlling an amount of polishing removal of the work based on the fluctuation of the current value component, on the current value component at the time when a certain angle of rotation of the carrier plate is achieved, or on the difference between the current value components at the times when two certain different angles of rotation of the carrier plate are achieved, due to the periodic change in the distance.

Further, an apparatus for polishing a work according to the present invention includes:

a carrier plate;

a retaining opening provided in the carrier plate, the center of the opening being positioned apart from the center of the carrier plate;

an upper plate and a lower plate, each provided with a polishing pad, between which a work held in the retaining opening is sandwiched; and a drive mechanism for rotating the carrier plate, and a pair of motors which rotates the upper plate and the lower plate, in which while the distance between the center of the upper plate and the lower plate and the center of the work changes periodically with the rotation of the carrier plate, front and back surfaces of the work are simultaneously polished with the polishing pads, the apparatus further comprising:

a measurement unit for measuring at least one of torque of the drive mechanism, upper plate, and lower plate; and a control unit for controlling the amount of polishing removal of the work based on the fluctuation of the torque component, on the torque component at the time when a certain angle of rotation of the carrier plate is achieved, or on the difference between the torque components at the times when two certain different angles of rotation of the carrier plate are achieved, due to the periodic change in said distance.

Another apparatus for polishing a work, according to the present invention includes:

a carrier plate;

a retaining opening provided in the carrier plate, the center of the opening being positioned apart from the center of the carrier plate;

an upper plate and a lower plate, each provided with a polishing pad, between which a work held in the retaining opening is sandwiched; and a drive mechanism for rotating the carrier plate, and a pair of motors which rotates the upper plate and the lower plate, in which while the distance between the center of the upper plate and the lower plate and the center of the work changes periodically with the rotation of the carrier plate, front and back surfaces of the works are simultaneously polished with the polishing pads, the apparatus further comprising:

a measurement unit for measuring at least one of current value of a motor for the drive mechanism, and current value of the pair of motors for rotating at least one of the upper plate and the lower plate; and a control unit for controlling an amount of polishing removal of the work based on the fluctuation of the current value component, on the current value component at the time when a certain angle of rotation of the carrier plate is achieved, or on the difference between the current value components at the times when two certain different angles of rotation of the carrier plate are achieved, due to the periodic change in said distance.

Advantageous Effect of Invention

A method for polishing a work and an apparatus for polishing a work according to the present invention enable capturing the torque component of a drive mechanism that changes periodically due to the periodic change in the distance between the center of an upper plate and a lower plate and the center of the work and the torque component for rotating the polishing plates, thereby controlling the amount of polishing removal of the work based on the fluctuation of the component and the like with higher accuracy.

BRIEF DESCRIPTION OF DRAWINGS

FIG. 2(A) is a schematic view showing a state where the distance D between the center of polishing plate and the center of a work is minimized. FIG. 2(B) is a schematic view showing a state where the distance D is maximized. FIG. 2(C) is a cross-sectional view taken along line I-I in FIG. 2(A). FIG. 2(D) is a cross-sectional view taken along line II-II in FIG. 2(B). FIG. 2(E) is a diagram showing the relationship between the distance D and the polishing time, whereas FIG. 2(F) is a diagram showing the relationship between the distance D and the torque component applied to the polishing plates.

FIG. 3(A) is a schematic view showing a state where the distance D between the center of polishing plate and the center of a work is minimized. FIG. 3(B) is a schematic view showing a state where the distance D is maximized. FIG. 3(C) is a cross-sectional view taken along line in FIG. 3(A). FIG. 3(D) is a cross-sectional view taken along line IV-IV in FIG. 3(B). FIG. 3(E) is a diagram showing the relationship between the distance D and the polishing time, whereas FIG. 3(F) is a diagram showing the relationship between the distance D and the torque component applied to the polishing plates.

FIG. 4(A) is a diagram showing a state before the rotation, whereas FIG. 4(B) is a diagram showing a state during the rotation.

FIG. 6(A) shows a state where the distances D between the works become equal and shortest, whereas FIG. 6(B) shows a state where the distances between the works become equal and longest.

DESCRIPTION OF EMBODIMENTS

A polishing apparatus 1 and a method for polishing a work according to an embodiment of the present invention will now be described with reference to the drawings.

Figure 1:
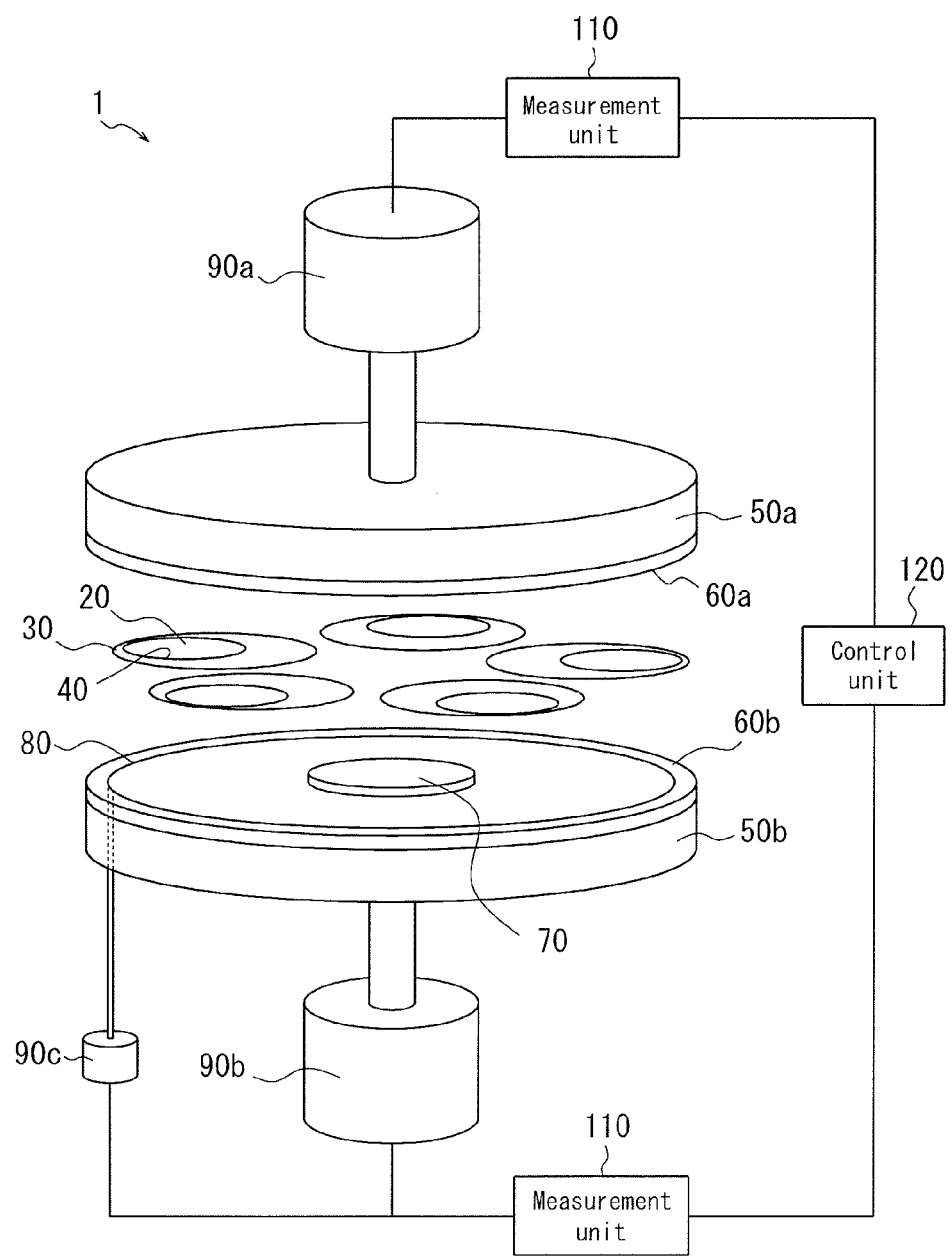
FIG. 1 is a schematic view of an apparatus for polishing a work according to an embodiment of the present invention.

First, a work polishing apparatus 1 according to an embodiment of the present invention is specifically described with reference to FIG. 1. The polishing apparatus 1 includes carrier plates 30 each having a retaining opening 40 for holding a work 20; an upper plate 50a and a lower plate 50b provided with polishing pads 60a and 60b, respectively; and a pair of motors 90a and 90b that rotate the upper plate 50a and the lower plate 50b, respectively. The centers of the retaining openings 40 are positioned apart from the centers of the relevant carrier plates 30. The works 20 held in the retaining openings 40 can be sandwiched between the upper plate 50a and the lower plate 50b with a constant pressure. The motors 90a and 90b rotate the upper plate 50a and the lower plate 50b in opposite directions. Further, the carrier plates 30 are each provided with an external gear (not shown) for the engagement with the sun gear 70 and the internal gear 80, which external gears are provided between the upper plate 50a and the lower plate 50b. Here, the sun gear 70 and/or the internal gear 80 compose a drive mechanism that is driven by motors different from the motors 90a and 90b and rotates the carrier plates 30. The external gears of the carrier plate 30 engage with the sun gear 70 and the internal gear 80, thereby rotating the carrier plates 30. The gear engagement between the sun gear 70, the internal gear 80, and the external gear is not shown so as to simplify the polishing apparatus 1. The internal gear 80 is composed of a number of pivot shafts provided with respective rotary drive shaft pins in the circumference direction. The individual pivot shafts engage with the external gears of the carrier plates 30, thereby rotating the carrier plates 30. Note that the individual pivot shafts are not shown so as to simplify the polishing apparatus 1. Further, for simplicity, FIG. 1 only shows a motor 90c of one of the pivot shafts of the internal gear 80, whereas the motor of the sun gear 70 is not shown.

With such gear engagement, while each carrier plate 30 spins around the center of the carrier plate 30 as the central axis (hereinafter, simply described to as "spin(ning)") with the rotation of the lower plate 50b by the motor 90b and the rotations of the sun gear 70 and/or the internal gear 80, it revolves around the sun gear 70 with the center of the upper plate 50a and the lower plate 50b being the central axis (hereinafter, simply described as "revolution"). In this embodiment, the center of each retaining opening 40 is positioned apart from the center of the relevant carrier plate 30, in other words, each work 20 is eccentric with respect to the center of the relevant carrier plate 30, so that the distance between the center of the upper plate 50a and the lower plate 50b and the center of the work 20 changes periodically with its spins. The polishing apparatus 1 makes the sandwiched carrier plates 30 spin and revolve to simultaneously subject both front and back surfaces of the works 20 to chemical mechanical polishing using the polishing pads 60a and 60b and slurry droplets (not shown).

Further, the polishing apparatus 1 has measurement units 110 described below, for measuring the current value of the motors 90a and 90b, and the motor 90c, and/or motors that are not shown. Specifically, the measurement units 110 measure the torque of the upper plate 50a and the lower plate 50b, and the drive mechanism (i.e., the sun gear 70 and/or the internal gear 80). Further, the polishing apparatus 1 has a control unit 120. The control to be performed by the control unit 120 is described below.

Here, the change in the torque of the upper plate 50a with the progress of polishing on one of the works 20 is described with reference to FIGS. 2(A) to 2(F) and 3(A) to 3(F). Note that the same applies to the change in the torque of the lower plate 50b and the drive mechanism. As shown in FIGS. 2(A) and 2(B) and FIGS. 3(A) and 3(B), as the lower plate 50b rotates and the drive mechanism is driven, one of the carrier plates 30 spin and revolve; meanwhile, the distance D between the center of the upper plate 50a and the lower plate 50b and the center of the work 20 periodically changes with the spins. FIG. 2(E) and FIG. 3(E) illustrate the states where the distance D changes periodically with the polishing time.

Figure 2A:
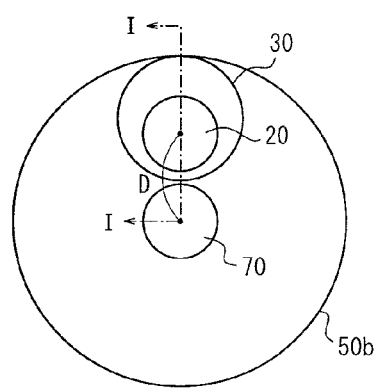
FIGS. 2(A) to 2(F) are diagrams illustrating early stages of polishing in a method for polishing a work according to an embodiment of the present invention.
Figure 2B:
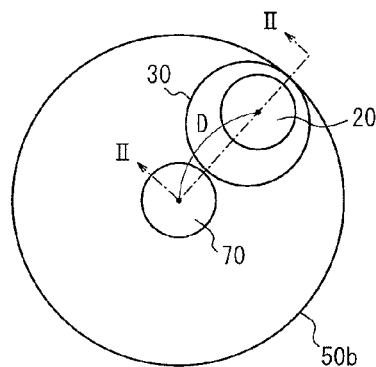
Figure 2C:
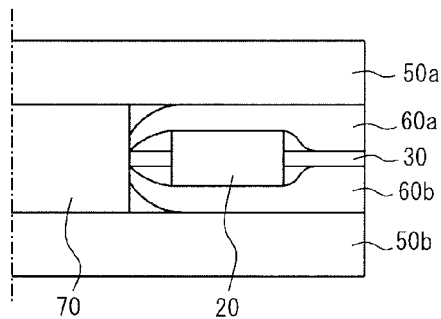
Figure 2D:
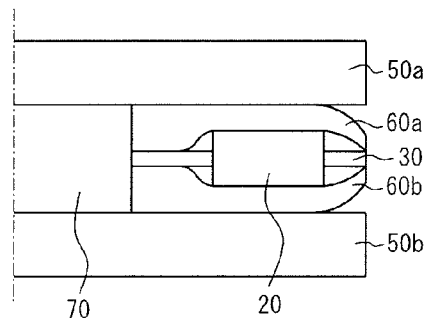
Figure 2E:
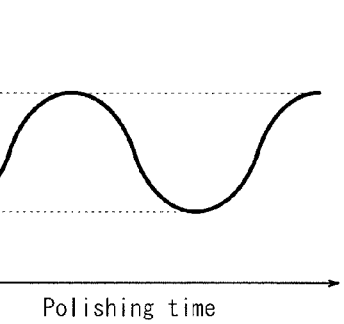
Figure 2F:
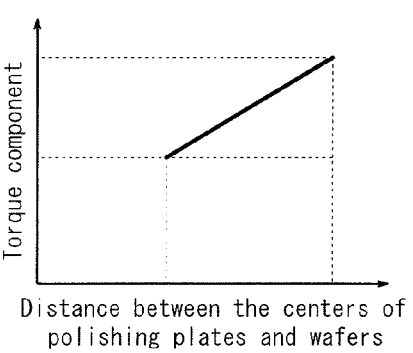

Here, as shown in FIGS. 2(C) and 2(D), in an early stage of polishing, the work 20 are thicker than the carrier plate 30, so that the pressures applied by both the polishing plates 50a and 50b are concentrated to a central area of each work 20. Therefore, the torque of the upper plate 50a includes a torque component that periodically changes in synchronization with the periodic change in the distance D between the center of both the polishing plates 50a and 50b and the center of each work 20 (that is, the rotation period of the spinning carrier plates 30) (FIG. 2(F)). Such a torque component that periodically changes in synchronization with the periodic change in the distance D is hereinafter simply referred to as "torque component".

Figure 3A:
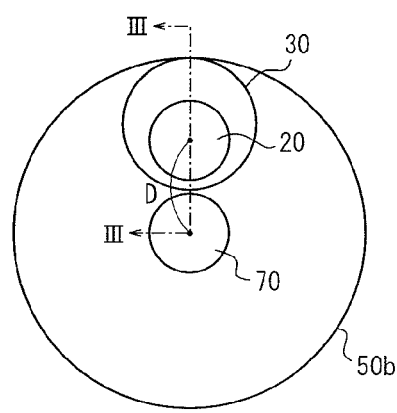
FIGS. 3(A) to 3(F) are diagrams illustrating end stages of polishing in a method for polishing a work according to an embodiment of the present invention.
Figure 3B:
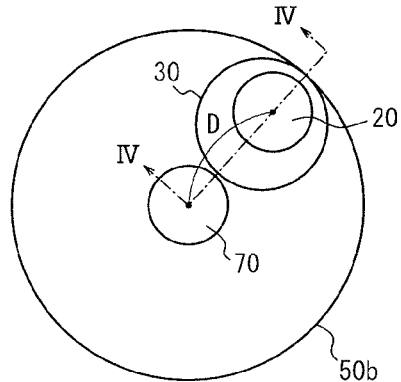
Figure 3C:
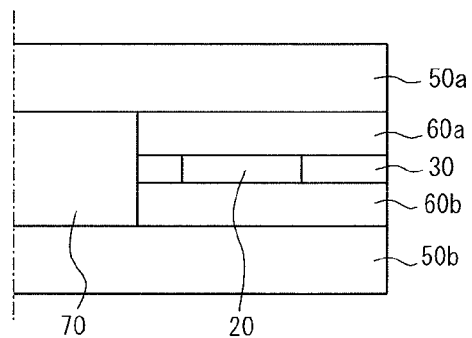
Figure 3D:
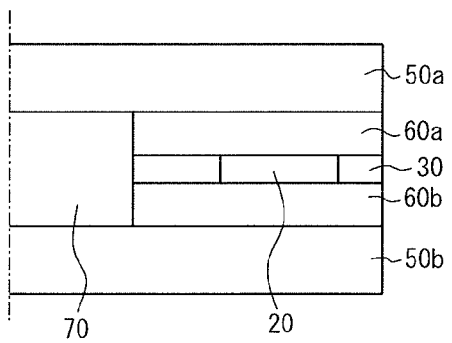
Figure 3E:
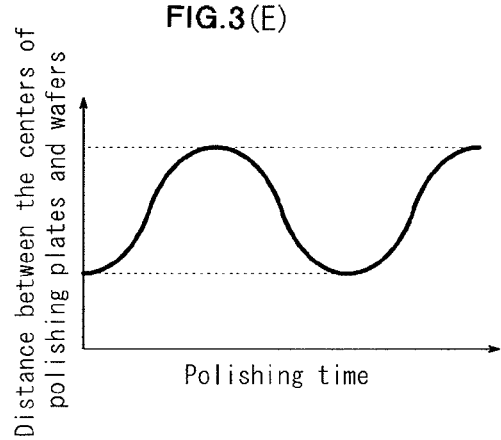
Figure 3F:
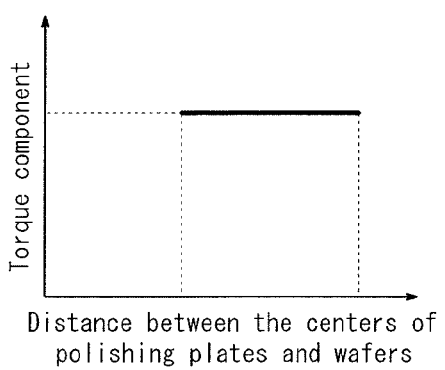

On the other hand, as shown in FIGS. 3(C) and 3(D), in an end stage of polishing, the thickness of the work 20 and the thickness of the carrier plate 30 become equal. Accordingly, irrespective of the distance D, the pressures applied to the carrier plate 30 and the work 20 by both the polishing plates 50a and 50b become even. Therefore, the above torque component becomes constant regardless of the distance D (FIG. 3(F)).

Further, in an intermediate stage of polishing, as compared to the early stage, the difference between the thickness of the work 20 and the thickness of the carrier plate 30 becomes smaller. Accordingly, the pressures applied to the central area of each work 20 by both the polishing plates 50a and 50b in the early stage of polishing are gradually distributed. Thus, the maximum displacement of the above torque component decreases as the polishing proceeds.

As described above, the fluctuation of the torque component gradually diminishes with the progress of polishing and becomes almost zero in the end stage of polishing, that is, when the thickness of the work 20 equals that of the carrier plate 30 (the torque component itself can be considered to disappear).

The measured value of the torque of the upper plate 50a, obtained by the measurement units 110 includes, in addition to the above torque component, background loads such as the operating current for operating the polishing apparatus 1 and noise. However, the above torque component can be extracted from the torque of the upper plate 50a. Specifically, this is made possible by simplifying the detected torque signal by the angle of the rotation of the carrier plate at the time of the detection, and then calculating its wave form. In calculating the wave form, for example, the approximation method can be used for the conversion into a trigonometric function using the least square method or the like. For the method for calculating the wave form, other than the above approach, for example, approaches such as averaging per rotation angle of the carrier plate or frequency analysis or the like by FFT (Fast Fourier Transform) can be used. Therefore, the fluctuation of the torque component provides an indication excluding the effect of the background loads such as the operating current for operating the polishing apparatus 1 and noise. Therefore, the torque component is extracted from the measured value of the torque and the fluctuation of the torque component is calculated, thereby controlling the amount of polishing removal of the work 20 based on the fluctuation.

The measurement unit 110 measures the current value of the motor 90a during the polishing of the work 20. In this embodiment, the torque of the upper plate 50a can be captured as the current value of the motor 90a rotating the upper plate 50a. Using the above extraction method, the control unit 120 extracts the current value component corresponding to the above torque component from the measured value of the current value, thereby controlling the amount of polishing removal of the work 20 based on the fluctuation of the current value component. For example, the association between the fluctuation of the current value component (i.e., the torque component) and the amount of polishing removal of the work 20 is previously determined using a testing work 20, and the association is recorded in the polishing apparatus 1. After that, a work 20 of the same type is polished, and meanwhile the fluctuation of the current value component obtained by measuring the current value of the motor 90a is applied to the above association, so that the amount of polishing removal of the work 20 at a given time can be captured and the amount of polishing removal of the work 20 can be controlled with high accuracy. Further, even if the association between the fluctuation and the amount of polishing removal of the work 20 is not recorded in the polishing apparatus 1, the amount of polishing removal can be controlled using the change in the fluctuation of the current value component with the progress of the polishing (decrease in the fluctuation).

As described above, the apparatus for polishing a work according to an embodiment of the present invention enables while eliminating the effect of the background loads such as the operating current or noise, capturing the torque component changing in synchronization with the periodic change in the distance D between the center of the upper plate and the lower plate and the center of the work, thereby controlling the amount of polishing removal of the work with high accuracy based on the fluctuation of the torque component. Further, such an apparatus can perform the method for polishing a work according to the present invention.

In this embodiment, the torque of the upper plate 50a is used; in addition, the torque of the lower plate 50b may be measured and its torque component may be extracted so that the torques of the upper plate 50a and the lower plate 50b are extracted.

Instead of the torque of the upper plate 50a as in the above embodiment, of the drive mechanism, for example, the torque of the internal gear 80 may be measured to extract its torque component. Of course, both the torque of the internal gear 80 and the torques of the upper plate 50a and the lower plate 50b may be extracted. Further, of the drive mechanism, instead of the torque of the internal gear 80, the torque of the sun gear 70 may be measured to extract its torque component.

Here, in the present invention, the amount of polishing removal can be controlled based on the following two indicators instead of the fluctuation of the above torque component. The first indicator is the torque component at the time when a specific angle of rotation of the carrier plates is achieved. The second indicator is the difference between the torque components at the times when two specific angles of rotation of the carrier plates are achieved. The details will be described below.

Figure 4A:
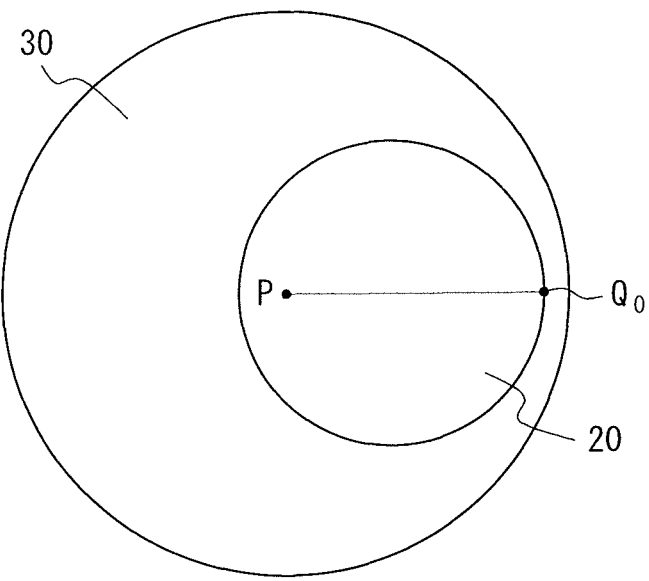
FIGS. 4(A) and 4(B) are diagrams illustrating the angle of rotation of a carrier plate in a method for polishing a work according to an embodiment of the present invention.
Figure 4B:
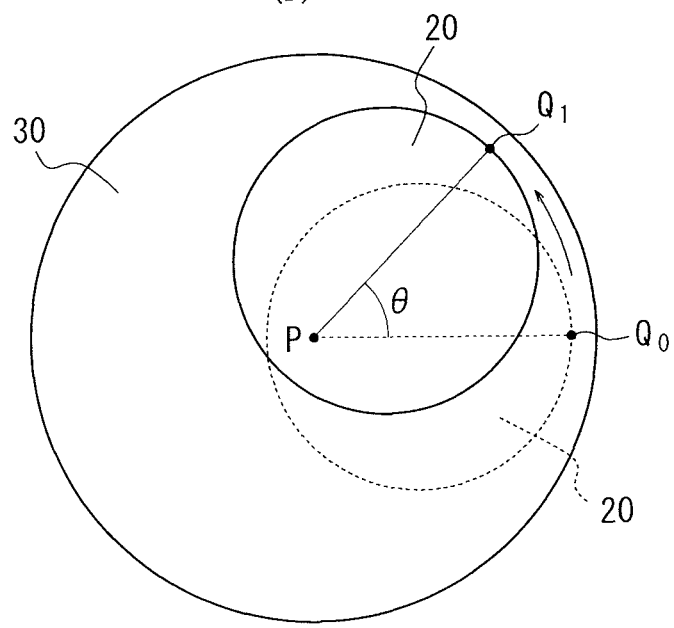

First, the rotation angle θ of the carrier plates will be described with reference to FIGS. 4(A) and 4(B). For the rotation angle θ, the revolutions of the carrier plates 30 are not required to be taken into consideration and their rotations by spinning are only considered. FIG. 4(A) shows one of the carrier plates 30 and one of the works 20 at a certain point, and the state is assumed to achieve an angle of rotation of zero. In FIG. 4(A), a point P is the center point of the carrier plate 30, and at $Q_0$, the distance from the point P to the work 20 is maximized. FIG. 4(B) is a diagram of the carrier plate 30 which has spun by a specific angle of 0. In FIG. 4(B), the distance from the point P to the work 20 is maximized at $Q_1$, and the angle formed by the point $Q_0$, point P, and point $Q_1$ is the angle of rotation θ.

Figure 5:
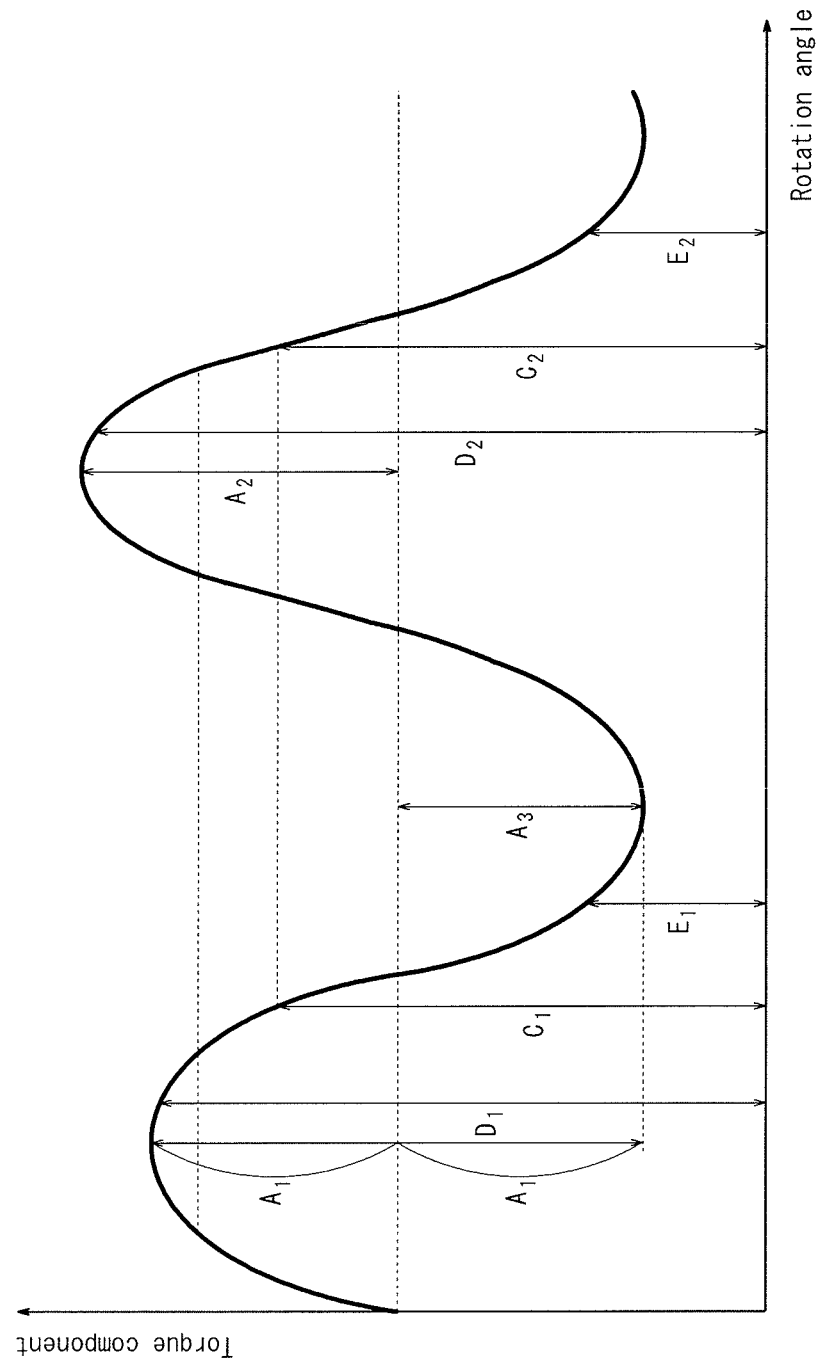
FIG. 5 is a diagram showing the relationship between the angle of rotation of a carrier plate and the torque component in a method for polishing a work according to an embodiment of the present invention.

FIG. 5 is a diagram showing the relationship between the angle of rotation and the torque component of the carrier plate 20. As shown in FIG. 5, the amount of polishing removal of the work 20 can be controlled based on, as the first indicator, the torque component ($C_1$, $C_2$, ...) at the time when a certain angle of rotation of the carrier plate 30 is achieved. Alternatively, the amount of polishing removal of the work 20 can be controlled based on, as the second indicator, the difference ($D_1-E_1$, $D_2-E_2$, ...) between the torque components at the times when certain two different angles of rotation of the carrier plate 30 are achieved. These indicators also decrease with the progress of polishing and become zero when the thickness of the work 20 becomes equal to that of the carrier plate 30. The fluctuation of the torque component can be defined in any manner and can be defined in various ways, for example, as $A_1$, that is, half the difference between the maximum value and the minimum value during one period; $A_2$, that is, the difference between the maximum value and the mean value; or $A_3$, that is, the difference between the mean value and the minimum value, as shown in FIG. 5.

The carrier plates 30 can be made of any given material, for example, steel special use stainless (SUS), or fiber reinforced plastic, that is, a combination of a resin such as epoxy, phenol, or polyimide and reinforcing fiber such as glass fiber, carbon fiber, or aramid fiber. In order to improve wear and abrasion resistance, diamond-like carbon may be applied to the surface of the foregoing material. Further, each carrier plate 30 may have a groove for retaining slurry droplets and the like in addition to the retention opening 40 and is configured to have a thickness smaller than that of the work 20.

The polishing pads 60a and 60b and slurry used for chemical mechanical polishing can be of any type. For example, for the polishing pads, a pad of non-woven cloth made of polyester or a pad made of polyurethane can be used. As the slurry droplets, for example, an alkaline aqueous solution containing free abrasive grains, an alkaline aqueous solution of free abrasive grains, or the like can be used.

The upper plate 50a and the lower plate 50b are desirably rotated in mutually opposite directions at the same rotational speed. The sun gear 70 and the internal gear 80 are engaged with the external gears of the carrier plates 30 and the carrier plates 30 spin as described above. Here, the spin speed of the carrier plates 30 is preferably made constant, thereby capturing the rotational period of the carrier plates from the time elapsed from the start of polishing to definitely calculate the fluctuation of the torque component. However, even if the spin speed is not constant, the fluctuation of the torque component can be calculated by measuring the angle of rotation of the carrier plates 30, for example using a rotation indicator or the like, so that the polishing method in accordance with the present invention can be implemented. In this case, it is possible to use the torque component at the time when a certain angle of rotation is achieved or the difference between the torque components at the times when certain two different angles of rotation are achieved. Note that, in the above embodiment, the polishing apparatus 1 performs polishing by spinning and revolving the carrier plates 30; however, the polishing method according to the present invention can be implemented by polishing by controlling the rotation of the internal gear 80 such that the carrier plates 30 only spin.

The torque can be measured by measuring the current value of the motor 90a as described above; alternatively, for example, the torque can be measured using a torque sensor or the like.

Figure 6A:
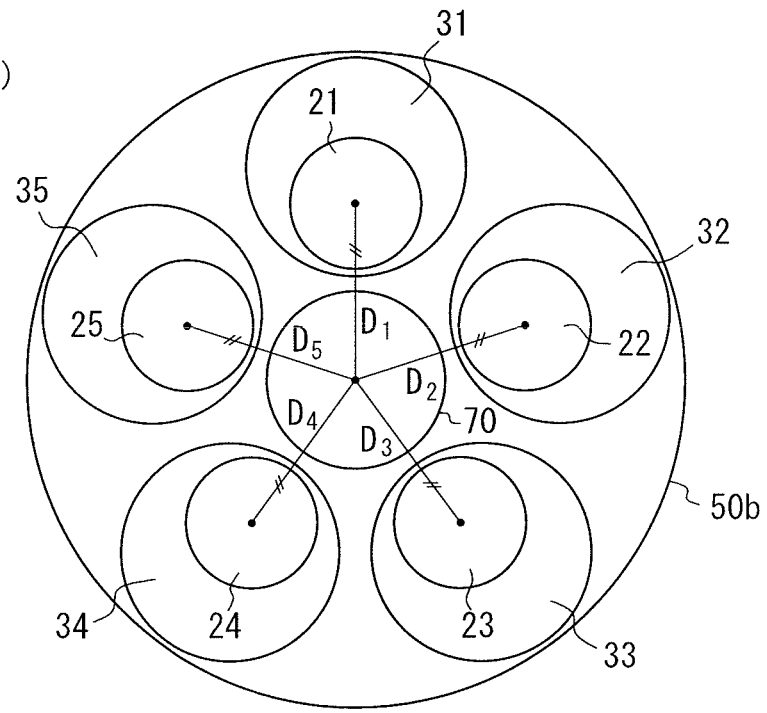
FIGS. 6(A) and 6(B) are schematic views each showing a preferable positional relationship between the plurality of works in the cases where both front and back surfaces of a plurality of works are simultaneously polished in a method for polishing a work according to an embodiment of the present invention.
Figure 6B:
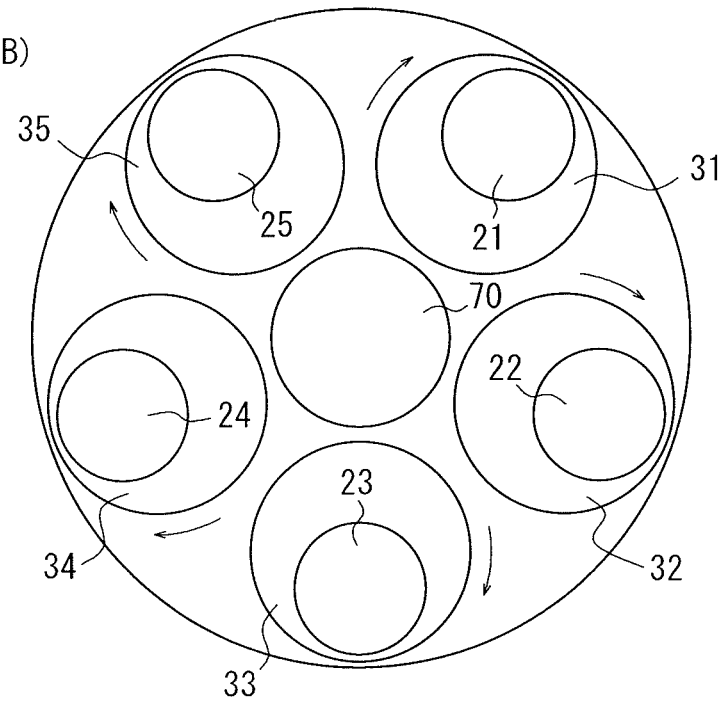

When a plurality of works are simultaneously polished, as shown in FIGS. 6(A) and 6(B), a plurality of carrier plates 31 to 35 provided with respective works 21 to 25 are placed between the upper plate 50a and the lower plate 50b, and for the works 21 to 25, it is preferable that the distances $D_1$ to $D_5$ between the centers of the polishing plates 50a and 50b and the centers of the works 21 to 25 change synchronizedly. FIG. 6(A) shows a state where the distances $D_1$ to $D_5$ are minimized synchronizedly, whereas FIG. 6(B) shows a state where the distances $D_1$ to $D_5$ are maximized synchronizedly. In this case, the above periodic changes in the torque components due to the respective works 21 to 25 coincide. Accordingly, the torques are not canceled by the works but rather they strengthen each other, so that the torque component can be more reliably extracted from the measured value of the torque. Thus, the amount of polishing removal of the plurality of works can be controlled with high accuracy. Note that as long as the torque component can be extracted, the distances $D_1$ to $D_5$ are of course not required to completely coincide as in FIG. 6.

Furthermore, as long as the torque component can be extracted, the polishing method according to the present invention can be performed even when two or more works are placed on one carrier plate.

In controlling the amount of polishing removal, it is preferable to terminate polishing when the fluctuation of the torque component is substantially eliminated. Here, the time when the fluctuation is substantially eliminated refers to the time when the torque component stops changing, and in such a state, the thickness of the works 20 and the thickness of the carrier plates 30 equal as described above. Therefore, polishing is terminated when the fluctuation of the torque component is substantially eliminated, so that the target amount of polishing removal of the work 20 can be accurately determined as the thickness of the carrier plate 30. Note that the time when the fluctuation of the torque component is substantially eliminated means the time when the fluctuation of the torque component is reduced to a negligible extent (for example, less than 5%) as compared with the fluctuation of the early stage of polishing or the time when it reaches the lower limit of detection.

Also when the change in the torque component at the time when the certain angle of rotation of the carrier plates is achieved, that is the above described first indicator, is eliminated, and when the difference in the torque components at the times when the two certain different angles of rotation of the carrier plates are achieved, that is the second indicator, is eliminated, polishing is preferably terminated.

Other than that, in cases where the time when the thickness of the works 20 is thicker than that of the carrier plates 30 is targeted in terms of the amount of polishing removal, polishing may be terminated before the fluctuation of the torque component is substantially eliminated. For example, in accordance with the target thickness of the works 20, polishing may be terminated at the time when the fluctuation reaches, for example, 30% or 10% of that of the torque component in the early stage of polishing. Further, in cases where polishing is carried out such that the thickness of the works 20 is even thinner than that of the carrier plates 30, after the above fluctuation is substantially eliminated, an additional polishing time corresponding to the target amount of polishing may be set to continue polishing for the set polishing time. Thus, the target amount of polishing of the works 20 can be accurately determined.

Moreover, in the present invention, the torques of both the upper plate 50a and the lower plate 50b may be measured to control the amount of polishing removal of the works 20 using the torques. For example, the average of the fluctuation of a torque component obtained from the measured value of the torque of the upper plate 50a and the fluctuation obtained from the measured value of the torque of the lower plate 50b can be used to reduce the error of measurement, thereby controlling the amount of polishing removal of the works 20 is achieved with higher accuracy. The same applies to the first and second indicators. In addition, the torque component of the drive mechanism may be used to control the amount of polishing removal of the works 20.

Further, in the present invention, it is also preferable to polish silicon wafers obtained by slicing a silicon ingot. Even in the case of using a silicon wafer which does not have an oxide film or the like, the torque component decreases with the progress of polishing irrespective of the presence of the film. Therefore, based on the change in the fluctuation of the torque component as in the present invention, even in the case of using a silicon wafer obtained by slicing a single crystal or polycrystalline silicon ingot, the amount of polishing removal can be controlled with accuracy.

However, the work to which the present invention is applied is not limited to a silicon wafer. For example, any given works to be subjected to double-side polishing, such as a SiC wafer, a sapphire wafer, and a compound semiconductor wafer are included in the works to which the present invention is applied.

In FIG. 1 to FIG. 4(B), and FIGS. 6(A) and 6(B), the works 20 are shown to have a circular shape; however, the works 20 and carrier plates 30 are not necessarily circular as long as the center of each work 20 is positioned apart from the center of the relevant carrier plate 30. The polishing method according to the present invention can be applied also to works 20 having a polygonal shape such as a circular shape which has a cutout or a quadrangular shape.

EXAMPLES

Now, the following examples are to be given to further clarify the effects of the present invention; however, the present invention is not limited to the following examples in any way.

Example 1

Tests were performed using a polishing apparatus having the structure described with reference to FIG. 1 and FIGS. 6(A) and 6(B). As works to be polished, p-type silicon wafers having an original thickness of 753 µm, diameter: 300 mm, crystal orientation: (110) was used. Double-side polishing was performed for five polishing times of 1000 seconds, 1500 seconds, 1800 seconds, 2200 seconds, and 2500 seconds. For five carrier plates, epoxy resin plates having an original thickness of 746 µm were used. Further, the center of each silicon wafer was positioned 30 mm apart from the center of the relevant carrier plate. An urethane foam polishing cloth MH-N15, manufactured by Nitta Haas Inc. was used for polishing pads; and Nalco 2350, produced by Nitta Haas Inco. was used as polishing slurry. While the carrier plates were held between an upper plate, and a lower plate and the upper plate and the carrier plates were rotated in mutually opposite directions with a constant pressure using an elevating device. The carrier plates were constantly rotated at 10 rpm in the same direction as the upper plate by the engagement between an internal gear, a sun gear, and external gears of the carrier plates to polish both front and back surfaces of the five silicon wafers loaded on the carrier plates. Note that the upper plate, lower plate, internal gear, and sun gear were rotated by respective different motors.

A measurement was performed per second using the current value of the motor for rotating the upper plate, thereby measuring the torque during polishing. The approximation method was used for the measured torque to be converted into a trigonometric function using the least square method, thereby calculating the fluctuation of the torque component. Note that in this example, the fluctuation was calculated as a half of the difference between the maximum value and the minimum value of the torque component.

Figure 7:
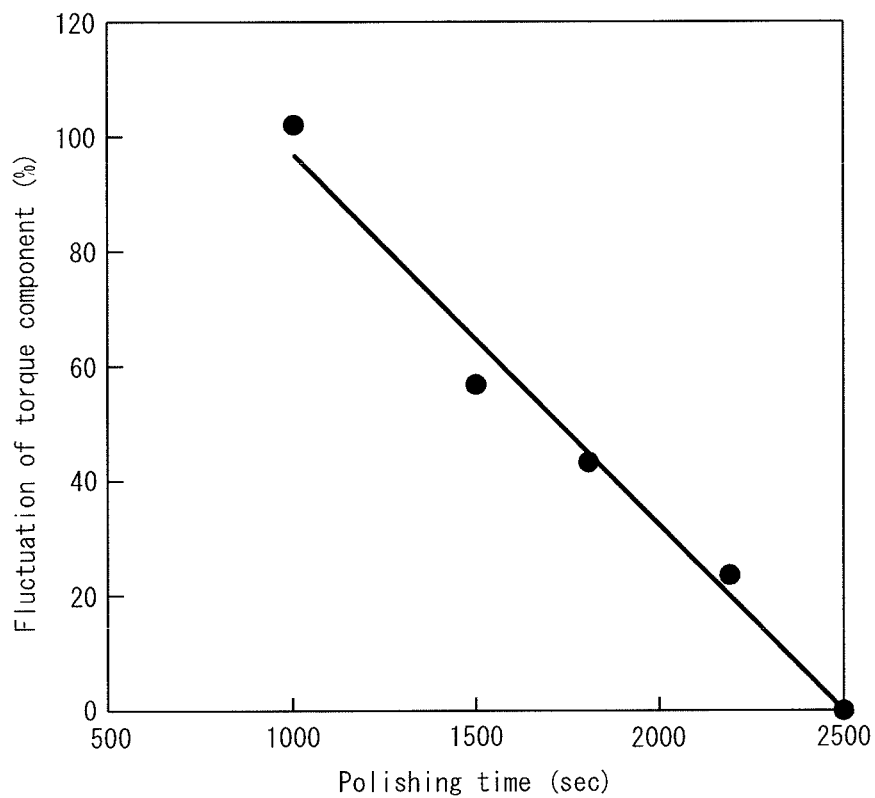
FIG. 7 is a graph showing the relationship between the polishing time and the fluctuation of the torque component in Example 1.

The fluctuations of the torque component at the end of polishing with respect to the above five polishing times are shown in FIG. 7. In FIG. 7, the fluctuation at the end of polishing on the vertical axis are expressed using relative values with the fluctuation at the end of polishing after a polishing time of 1000 seconds being 100%. The same applies to FIGS. 8 to 10.

Figure 8:
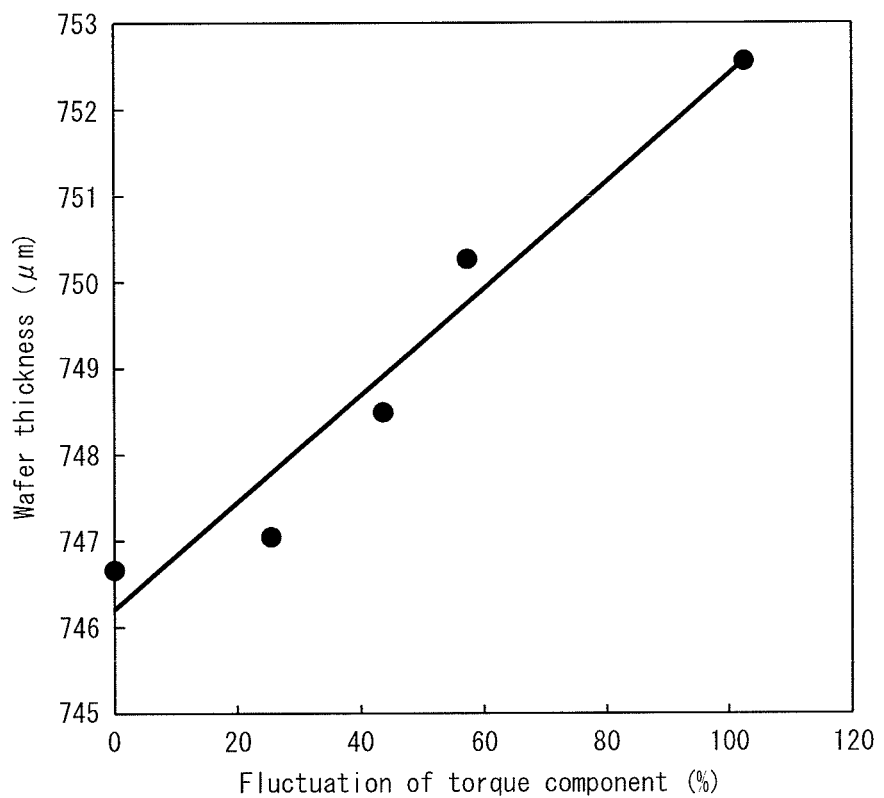
FIG. 8 is a graph showing the relationship between the fluctuation of the torque component and the thickness of a wafer in Example 1.

FIG. 8 shows the relationship between the fluctuation of the torque component and the thickness of the wafers at the end of polishing.

Figure 9:
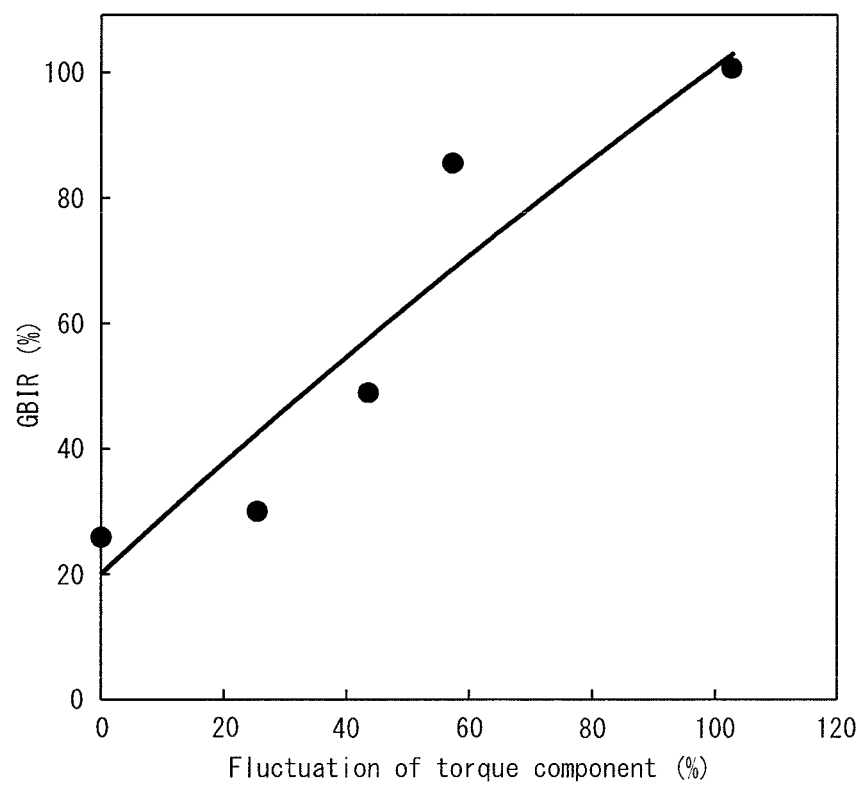
FIG. 9 is a graph showing the relationship between the fluctuation of the torque component and the GBIR in Example 1.

Further, FIG. 9 shows the relationship between the fluctuation of the torque component and the global backside ideal focal plane range GBIR (Global Backside Ideal focal plane Range) of the vicinity of the periphery of the wafers. Here, the GBIR is an indicator representing the flatness of the entire surface of the wafers and a smaller GBIR means a higher flatness. The GBIR can be found specifically by calculating the difference between the maximum displacement and the minimum displacement of the entire wafer on the basis of the rear surface of the wafer that is assumed to be completely stuck. In this example, a flatness measurement system (WaferSight manufactured by KLA-Tencor Corporation) was used for the measurement.

Figure 10:
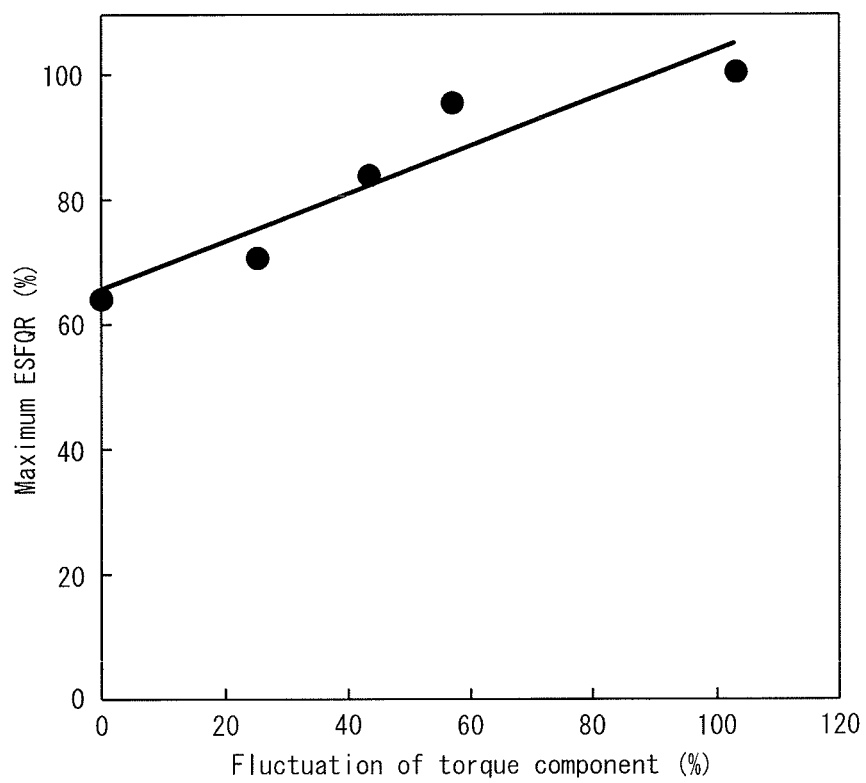
FIG. 10 is a graph showing the relationship between the fluctuation of the torque component and the maximum value of the ESFQR in Example 1.

Further, FIG. 10 shows the relationship between the fluctuation of the torque component and the maximum value of the Edge flatness metric, Sector based, Front surface referenced, Site Front least sQuares Range (ESFQR) of the vicinity of the periphery of the wafers. Here, the ESFQR is an SFQR measured with respect to fan-shaped regions (sectors) formed in the entire peripheral area of the wafer, and a smaller ESFQR means that the flatness is higher. In this example, a flatness measurement system (WaferSight manufactured by KLA-Tencor) was used for the measurement. Note that the SFQR (Site Front least sQuares Range) is an indicator representing the flatness of the periphery of the wafers in accordance with the SEMI standards. This SFQR is specifically found by obtaining a plurality of rectangular samples having a predetermined size from the wafer and calculating the sum of the absolute values of the maximum amounts of displacement from the reference planes of the obtained samples found by the least square method.

FIG. 7 shows that the fluctuation of the torque component is converging to zero as the polishing proceeds. Further, FIGS. 8 to 10 show that there is a strong correlation between the fluctuation of the torque component and the thickness and flatness of the wafers. Thus, according to the present invention, it can be seen that not only the thickness of the wafers but the flatness of the wafers can be controlled. Therefore, the amount of polishing removal of the wafers can be accurately controlled by the polishing method of the present invention.

Example 2

Polishing was performed on both front and back surfaces of silicon wafers in the same manner as in Example 1 except that the current value of the motor for the internal gear as a drive mechanism was measured instead of the current value of the motor for upper plate. The polishing was performed for six polishing times of 1000 seconds, 1500 seconds, 1800 seconds, 2000 seconds, 2200 seconds, and 2500 seconds. As in Example 1, the torque was measured from the current value of the motor for the internal gear, thereby calculating the fluctuation of the torque component from the measured torque.

Figure 11:
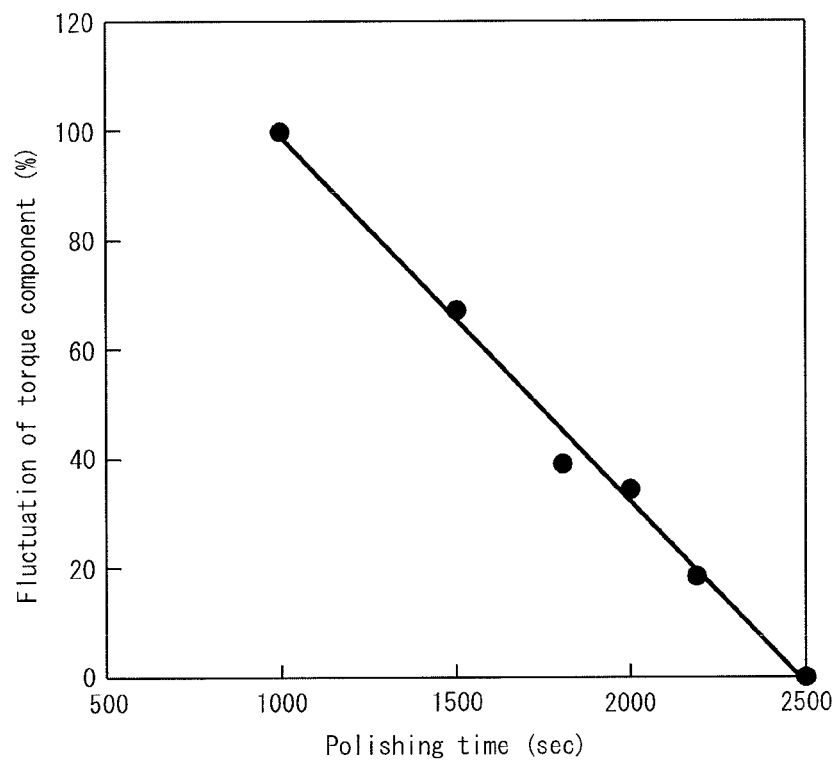
FIG. 11 is a graph showing the relationship between the polishing time and the fluctuation of the torque component in Example 2.
Figure 12:
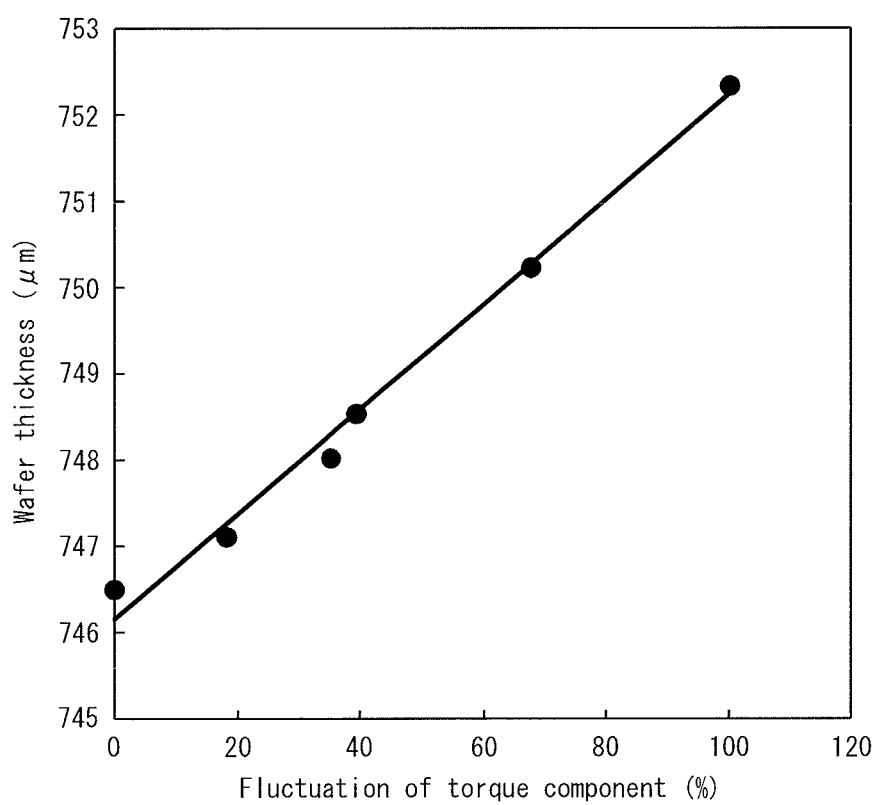
FIG. 12 is a graph showing the relationship between the fluctuation of the torque component and the thickness of a wafer in Example 2.
Figure 13:
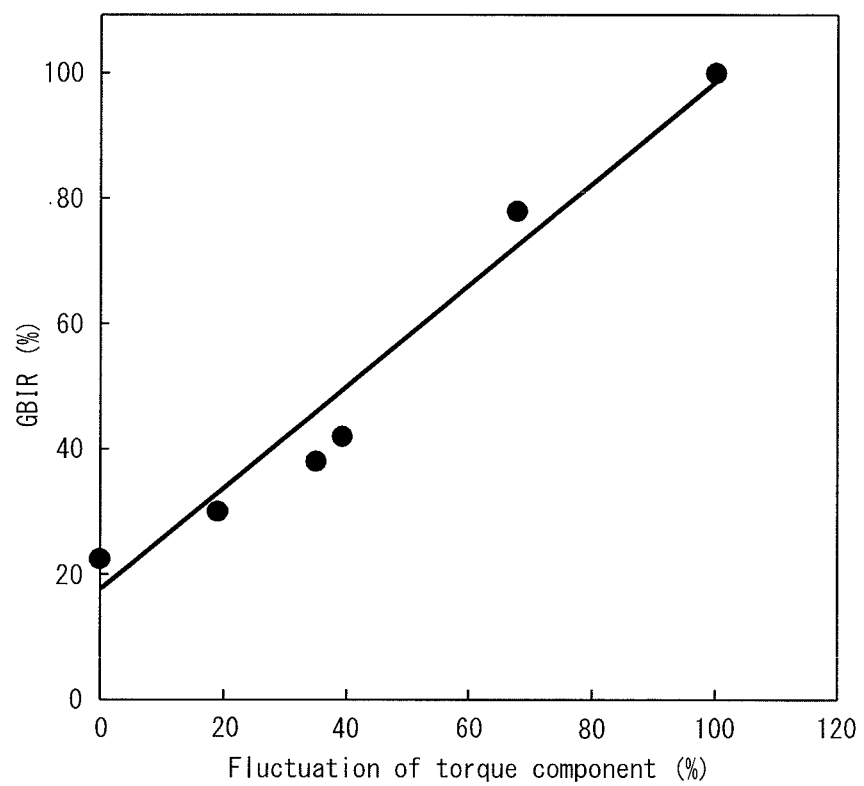
FIG. 13 is a graph showing the relationship between the fluctuation of the torque component and the GBIR in Example 2.
Figure 14:
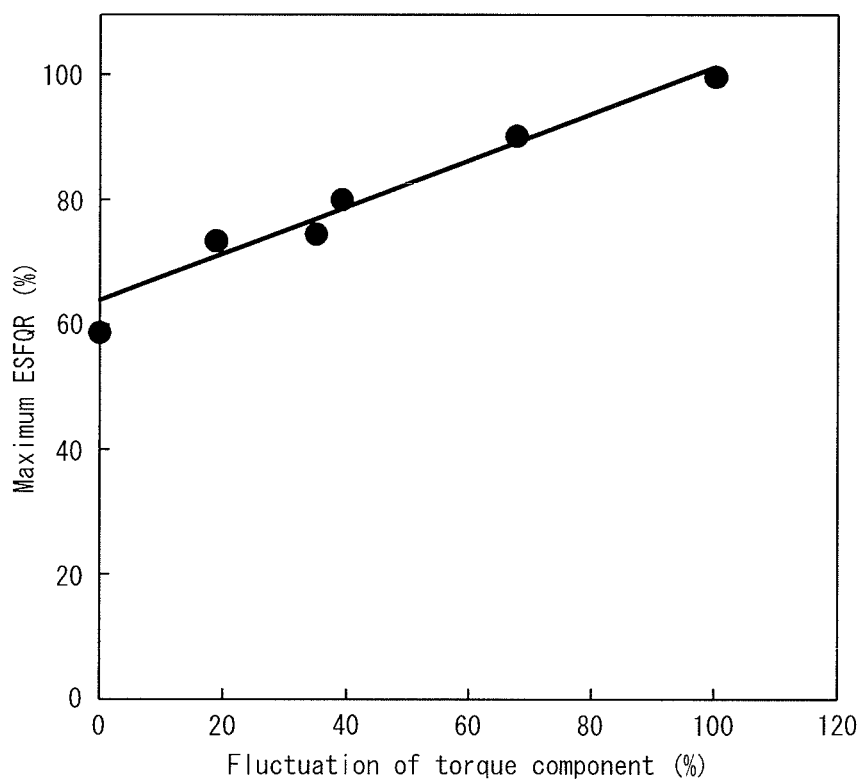
FIG. 14 is a graph showing the relationship between the fluctuation of the torque component and the maximum value of the ESFQR in Example 2.

The fluctuation of the torque component at the end of polishing is shown in FIG. 11. FIG. 12 shows the relationship between the fluctuation of the torque component and the thickness of the wafers at the end of polishing. FIG. 13 shows the relationship between the fluctuation of the torque component and the GBIR of the vicinity of the periphery of the wafers. FIG. 14 shows the relationship between the fluctuation of the torque component and the maximum value of the ESFQR of the vicinity of the periphery of the wafers.

FIG. 11 shows that as in Example 1, the fluctuation of the torque component is converging to zero as the polishing proceeds. Further, FIGS. 12 to 14 also show that there is a strong correlation between the fluctuation of the torque component and the thickness and flatness of the wafers as in Example 1. Accordingly, it is seen that the amount of polishing removal of the wafers can be accurately controlled also, based on the torque component of the drive mechanism.

INDUSTRIAL APPLICABILITY

The method and apparatus for polishing a work, of the present invention enables capturing the torque component for rotating polishing plates that periodically changes in accordance with the periodic change in the distance between the center of an upper plate and a lower plate and the center of each work, thereby controlling the amount of polishing removal of the work with higher accuracy based on the fluctuation of the component.

REFERENCE SIGNS LIST

1: Polishing apparatus
20: Work
30: Carrier plate
40: Retaining opening
50a: Upper plate
50b: Lower plate
60a: Polishing pad
60b: Polishing pad
70: Sun gear
80: Internal gear
90a: Motor
90b: Motor
90c: Motor
110: Measurement unit
120: Control unit

The invention claimed is:

1. A method for polishing a work, in which work held in a retaining opening provided in a carrier plate, the center of the retaining opening being positioned apart from the center of the carrier plate, is sandwiched between an upper plate and a lower plate each provided with a polishing pad; the carrier plate is rotated by a drive mechanism; and the upper plate and the lower plate are also rotated, so that the distance between the center of the upper plate and the lower plate and the center of the work changes periodically with the rotation of the carrier plate, and front and back surfaces of the work are simultaneously polished with the polishing pads comprising the steps of:

measuring at least one of torque of the drive mechanism, the upper plate, and the lower plate; and controlling an amount of polishing removal of the work based on the fluctuation of the torque component, on the torque component at the time when a certain angle of rotation of the carrier plate is achieved, or on the difference between the torque components at the times when two certain different angles of rotation of the carrier plates are achieved, due to the periodic change in the distance.

2. The method for polishing a work, according to claim 1, wherein a plurality of the carrier plates provided with the respective works are provided between the upper plate and the lower plate, and said distances with respect to each work change synchronizedly.

3. The method for polishing a work, according to claim 1, wherein the polishing is terminated when the fluctuation of the torque component stops, when the torque component at the time when a certain angle of rotation of the carrier plate is achieved stops changing, or when the difference between the torque components at the times when two certain different angles of rotation of the carrier plate is eliminated.

4. The method for polishing a work, according to claim 1, wherein the torques of the upper plate and the lower plate are measured thereby controlling the amount of polishing removal of the work using the torques.

5. The method for polishing a work, according to claim 1, wherein the work is a silicon wafer obtained by slicing a silicon ingot.

6. A method for polishing a work, in which work held in a retaining opening provided in a carrier plate, the center of the retaining opening being positioned apart from the center of the carrier plate, is sandwiched between an upper plate and a lower plate each provided with a polishing pad; the carrier plate is rotated by a drive mechanism; and the upper plate and the lower plate are also rotated, so that the distance between the center of the upper plate and the lower plate and the center of the work changes periodically with the rotation of the carrier plate, and front and back surfaces of the work are simultaneously polished with the polishing pads, comprising the steps of:

measuring at least one of current value of a motor of the drive mechanism, and current value of a motor for rotating at least one of the upper plate and the lower plate; and controlling an amount of polishing removal of the work based on the fluctuation of the current value component, on the current value component at the time when a certain angle of rotation of the carrier plate is achieved, or on the difference between the current value components at the times when two certain different angles of rotation of the carrier plate are achieved, due to the periodic change in the distance.

7. An apparatus for polishing a work, including:

a carrier plate;

a retaining opening provided in the carrier plate, the center of the opening being positioned apart from the center of the carrier plate;

an upper plate and a lower plate, each provided with a polishing pad, between which a work held in the retaining opening is sandwiched; and a drive mechanism for rotating the carrier plate, and a pair of motors which rotates the upper plate and the lower plate, in which while the distance between the center of the upper plate and the lower plate and the center of the work changes periodically with the rotation of the carrier plate, front and back surfaces of the work are simultaneously polished with the polishing pads, the apparatus further comprising:

a measurement unit for measuring at least one of torque of the drive mechanism, upper plate, and lower plate; and a control unit for controlling the amount of polishing removal of the work based on the fluctuation of the torque component, on the torque component at the time when a certain angle of rotation of the carrier plate is achieved, or on the difference between the torque components at the times when two certain different angles of rotation of the carrier plate are achieved, due to the periodic change in said distance.

8. An apparatus for polishing a work, including:

a carrier plate;

a retaining opening provided in the carrier plate, the center of the opening being positioned apart from the center of the carrier plate;

an upper plate and a lower plate, each provided with a polishing pad, between which a work held in the retaining opening is sandwiched; and a drive mechanism for rotating the carrier plate, and a pair of motors which rotates the upper plate and the lower plate, in which while the distance between the center of the upper plate and the lower plate and the center of the work changes periodically with the rotation of the carrier plate, front and back surfaces of the work are simultaneously polished with the polishing pads, the apparatus further comprising:

a measurement unit for measuring at least one of current value of a motor for the drive mechanism, and current value of the pair of motors for rotating at least one of the upper plate and the lower plate; and a control unit for controlling an amount of polishing removal of the work based on the fluctuation of the current value component, on the current value component at the time when a certain angle of rotation of the carrier plate is achieved, or on the difference between the current value components at the times when two certain different angles of rotation of the carrier plate are achieved, due to the periodic change in said distance.

* * * * *